(12) United States Patent
Fried et al.

(10) Patent No.: US 6,664,582 B2
(45) Date of Patent: Dec. 16, 2003

(54) FIN MEMORY CELL AND METHOD OF FABRICATION

(75) Inventors: David M. Fried, Ithaca, NY (US); Edward J. Nowak, Essex Junction, VT (US); Beth Ann Rainey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,330

(22) Filed: Apr. 12, 2002

(65) Prior Publication Data

US 2003/0197194 A1 Oct. 23, 2003

(51) Int. Cl.[7] .............................................. H01L 27/108
(52) U.S. Cl. ........................ 257/308; 257/310; 438/399; 361/303
(58) Field of Search ................................ 257/308, 310; 438/399; 361/303

(56) References Cited

U.S. PATENT DOCUMENTS

| | | | |
|---|---|---|---|
| 5,266,512 A | * 11/1993 | Kirsch | 438/253 |
| 5,323,038 A | * 6/1994 | Gonzalez et al. | 257/308 |
| 5,460,999 A | * 10/1995 | Hong et al. | 438/397 |
| 5,497,019 A | 3/1996 | Mayer et al. | |
| 5,502,332 A | * 3/1996 | Ikemasu et al. | 257/620 |
| 5,666,311 A | 9/1997 | Mori | |
| 5,858,841 A | 1/1999 | Hsu | |
| 6,064,085 A | * 5/2000 | Wu | 257/296 |
| 6,064,090 A | 5/2000 | Miyamoto et al. | |
| 6,078,493 A | * 6/2000 | Kang | 361/303 |
| 6,121,651 A | 9/2000 | Furukawa et al. | |
| 6,261,886 B1 | 7/2001 | Houston | |

OTHER PUBLICATIONS

"1G DRAM cell with diagonal bit–line (DBL) confifuration and edge MOS (ESO) FET", Shibahara, et al., Electron Devices Meeting, 1994, Technical Digest, International, 1994, pp. 639–642.

"Effects a new trench-isolated transistor using sidewall gates", Hieda, et al., Hamamoto Electron Devices, IEEE Transaction on, vol. 36, Issue 9, Part 2, Sep. 1989, 1615–1619.

* cited by examiner

Primary Examiner—David Nelms
Assistant Examiner—Andy Huynh
(74) Attorney, Agent, or Firm—Schmeiser, Olsen & Watts; Mark F. Chadurjian

(57) ABSTRACT

The present invention provides a memory cell and method for forming the same that results in improved cell density without overly increasing fabrication cost and complexity. The preferred embodiment of the present invention provides a fin design to form the memory cell. Specifically, a fin Field Effect Transistor (FET) is formed to provide the access transistor, and a fin capacitor is formed to provide the storage capacitor. By forming the memory cell with a fin FET and fin capacitor, the memory cell density can be greatly increased over traditional planar capacitor designs. Additionally, the memory cell can be formed with significantly less process cost and complexity than traditional deep trench capacitor designs.

20 Claims, 14 Drawing Sheets

FIN MEMORY CELL AND METHOD OF FABRICATION

BACKGROUND OF THE INVENTION

Technical Field

The present invention relates generally to the field of semiconductor manufacturing and, more specifically, to a method for forming double gated field effect transistors.

The need to remain cost and performance competitive in the production of semiconductor devices has driven the increase in device density in integrated circuits. To facilitate the increase in device density, new technologies are constantly needed to allow the feature size of these semiconductor devices to be reduced.

The push for ever increasing device densities is particularly strong in Dynamic Random Access Memory (DRAM) technologies. DRAMs are the most commonly used type of memory and are thus found in a wide variety of integrated circuit designs. DRAM is often embedded into application specific integrated circuits (ASICs), such as processors and logic devices.

Each DRAM cell contains an access transistor and a capacitor used to store the memory data. The two most common types of capacitors used to store the memory are deep trench and planar capacitors. Deep trench capacitors generally have the advantage of increased memory density, but have the disadvantage of increased process complexity and cost. For this reason, deep trench capacitors are generally only used where the large number of memory cells can justify the increased process cost. In contrast, planar capacitors can be manufactured using much simpler manufacturing techniques, and generally do not add excessive processing costs to the device. However, planar capacitors do not provide the cell density that deep trench capacitors do, and thus are limited to applications in which the number of memory cells needed is relatively low.

Thus, there is a need for improved memory structure and method of fabrication that provides for increased DRAM memory cell density without excessively increasing fabrication complexity and cost.

BRIEF SUMMARY OF THE INVENTION

Accordingly, the present invention provides a memory cell and method for forming the same that results in improved cell density without overly increasing fabrication cost and complexity. The preferred embodiment of the present invention provides a fin design to form the memory cell. Specifically, a fin Field Effect Transistor (FET) is formed to provide the access transistor, and a fin capacitor is formed to provide the storage capacitor. By forming the memory cell with a fin FET and fin capacitor, the memory cell density can be greatly increased over traditional planar capacitor designs. Additionally, the memory cell can be formed with significantly less process cost and complexity than traditional deep trench capacitor designs.

The foregoing and other advantages and features of the invention will be apparent from the following more particular description of a preferred embodiment of the invention, as illustrated in the accompanying drawings.

BRIEF DESCRIPTION OF THE SEVERAL VIEWS OF THE DRAWINGS

The preferred exemplary embodiment of the present invention will hereinafter be described in conjunction with the appended drawings, where like designations denote like elements.

DETAILED DESCRIPTION OF THE INVENTION

Figure 1:
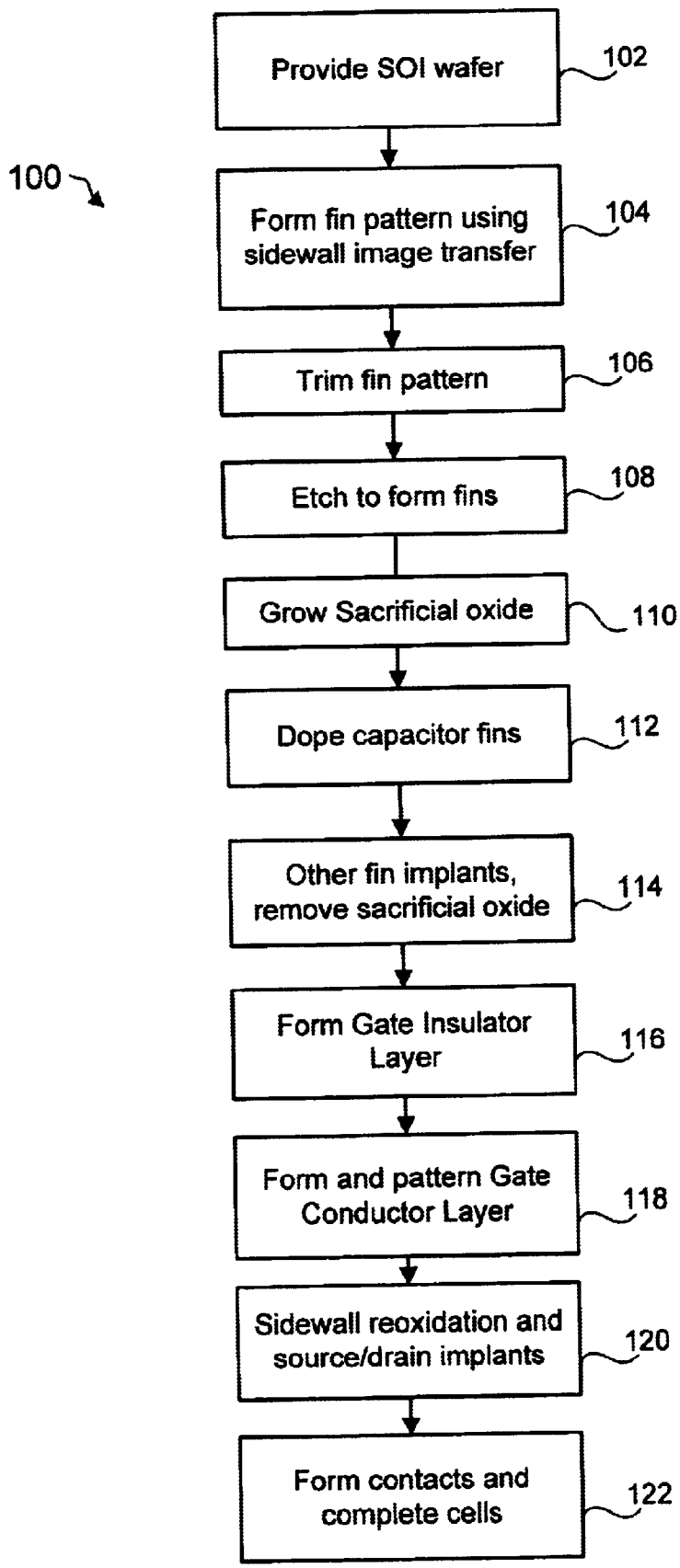
FIG. 1 is a flow diagram illustrating a first fabrication method.

Accordingly, the present invention provides a memory cell and method for forming the same that results in improved cell density without overly increasing fabrication cost and complexity. The preferred embodiment of the present invention uses a fin design to form the memory cell. Specifically, a fin Field Effect Transistor (FET) is formed to provide the access transistor, and a fin capacitor is formed to provide the storage capacitor. By forming the memory cell with a fin FET and fin capacitor, the memory cell density can be greatly increased over traditional planar capacitor designs. Additionally, the memory cell can be formed with significantly less process cost and complexity than traditional deep trench capacitor designs.

In fin FET technologies, the body of the transistor is formed with a vertical "fin" shape. The gates of the transistor are then formed on one or more sides of the fin. The preferred method for forming this double gated transistors allows the gate length of the device to have minimum feature size, while allowing the thickness of the body to be much smaller than the gate length. Generally, it is desirable to make the fin narrow enough insure a fully depleted channel during operation of the transistor. This improves control of the threshold voltage of the resulting device. The preferred method for forming the fin FET accomplishes this by using an image enhancement technique, sidewall image transfer, to define the thickness of the transistor body, allowing it to be reliably formed at sub minimum feature size.

The memory cell of the current invention also forms the storage capacitor using the fin shaped body. Specifically, a portion of the fin body will be highly doped and made to comprise the storage node of the memory cell capacitor. An insulator layer is then formed on the fin sidewalls, and a common counter electrode is formed over the fins to complete the fin capacitor. These fin capacitors have the advantage of providing a high device density without requiring excessive process complexity.

The memory cell of the current invention has density advantages over typical planar memory cells for several reasons. First, the use of a fin FET for the transfer transistor has density advantages over typical planar transistors. Second, the fin structure of the capacitor allows for greater capacitance in a limited space than can be accomplished using typical planar capacitor technology. This is because both sides of the fin comprise capacitor storage area. Fins are typically formed one lithographic unit high and thus the fin capacitor can have twice the capacitor storage area of the typical planar capacitor. Further advantage yet is attainable through the use of taller fins to obtain greater storage capacitance without any penalty to the physical cell area. Taken together, a fin memory cell can thus be formed in less than ten lithographic squares, depending upon the area allocated to the fin capacitor. For example, if the capacitor is limited in width to the minimum feature size, the memory cell can be formed in nine lithographic squares.

In contrast, the typical planar DRAM cell must be at least 25% larger for equivalent lithographic feature size. This is because silicon mesas used to form the FET and the storage node must be at least on lithographic square wide, and hence the entire cell must grow to accommodate this size. Even with the increase in layout area, the typical planar DRAM cell will have half the capacitance of the fin memory cell because of the added capacitance of the fin capacitor discussed above. In contrast, in typical planar cells the cell area must be increased to increase the storage area.

Thus, the fin memory cell can provide high density memory arrays for storage used in embedded applications at low process cost.

Turning now to FIG. 1, a method 100 for forming a fin memory cell in accordance with the preferred embodiment is illustrated. Method 100 forms a fin memory cell in a way that provides increased device density, while maintaining fabrication simplicity and reducing costs.

The first step 102 of method 100 is to provide an appropriate wafer. In the preferred embodiment, the wafer used comprises a silicon on insulator (SOI) wafer. As such, the wafer is comprised of a buried oxide layer beneath an SOI layer. As will be come clear, the SOI layer is used to form the body of the double gated transistor. As such, it is generally preferable to use a SOI layer that has a p-type doping density in the range of $5 \times 10^{15}$ cm$^{-3}$ to $8 \times 10^{18}$ cm$^{-3}$ to provide proper centering and control of the threshold voltage of the transistors. However, in another embodiment to be described later, the doping of the SOI layer is done later with an appropriate implant.

However, non-SOI wafers can be used. When a non-SOI wafer is used, the processing remains otherwise identical to those of the SOI wafer case, except as noted.

The next step 104 of method 100 is to form a fin pattern using sidewall image transfer. It is generally desirable to have the fin thickness narrower than the gate length. Typically, the fin thickness should be less than one quarter of the gate length to give good threshold voltage control. Also, it is generally desirable that the fin thickness should be greater than 2.5 nm to avoid degraded mobility due to quantum confinement issues. As the gate length is generally made to minimum feature size, sidewall image transfer is used to achieve the subminimum feature size of the fin.

Sidewall image transfer typically involves the formation of a mandrel layer and at least one etch stop layer. The mandrel layer is then patterned, and sidewall spacers are formed on the sidewalls of the patterned mandrel layer. These sidewall spacers will be used to define the fins, completing the sidewall image transfer. Sidewall image transfer provides many advantages, the most notable being that it allows features to be accurately fabricated below the minimum lithographic feature size. Specifically, because sidewall image transfer is used to define the fins, the fins of the transistor can be accurately formed with a narrower width than could be formed using traditional lithography. The fin width is determined by the spacer width. Spacer width can be etched much narrower than the fin can be printed and formed using conventional lithography.

The mandrel layer is thus first patterned to define shapes such that the exterior perimeter of the shapes will provide the sidewalls used to define the spacers. The mandrel layer preferably comprises a layer of oxide or other suitable material. Generally it will be desirable for the mandrel layer to have a thickness of between 10 nm and 100 nm, however, such a thickness may change depending on the desired body thickness. The sidewall spacer can be formed using a deposition of silicon nitride or other suitable material, followed by a suitable directional etch.

Figure 2:
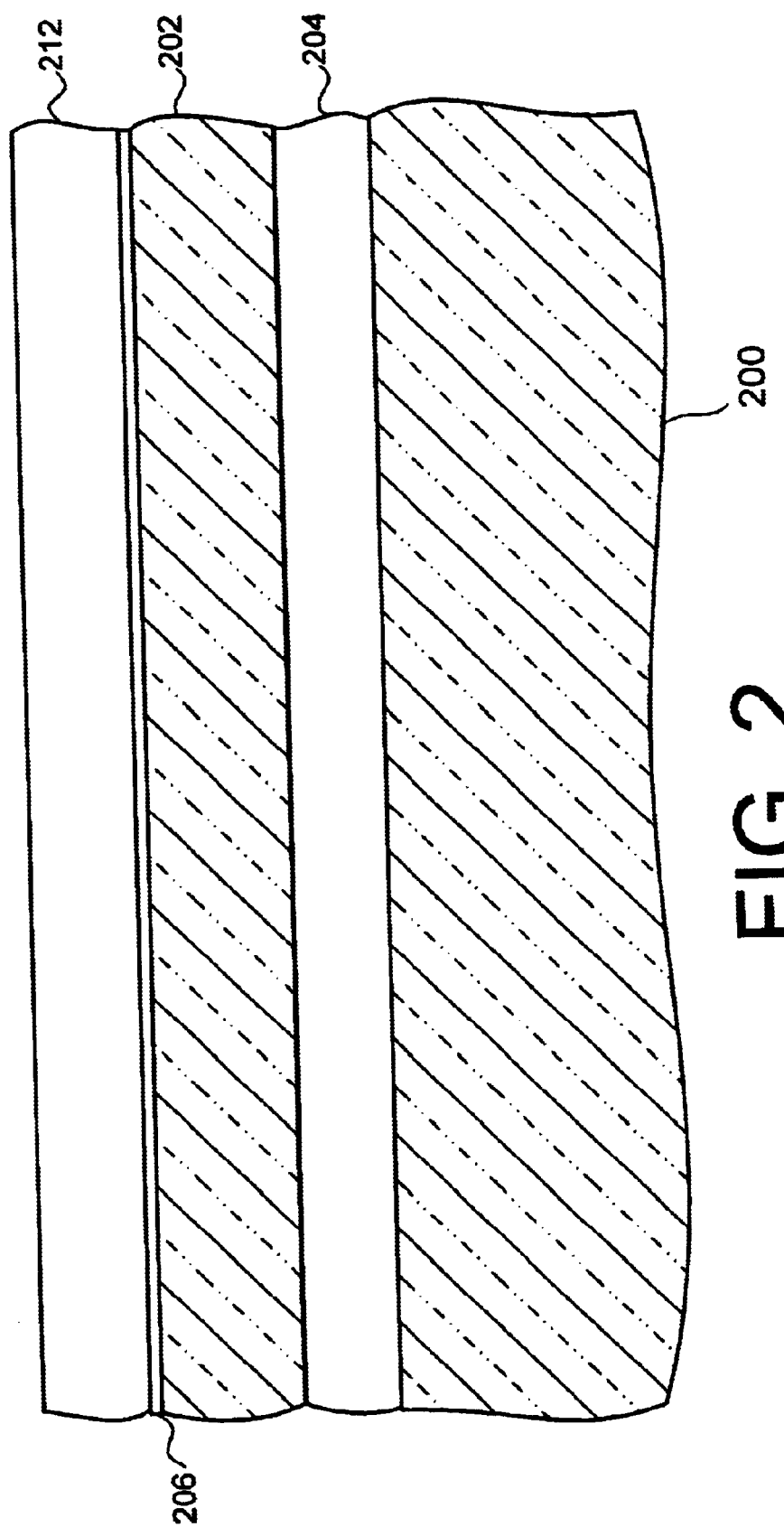
FIGS. 2, 3, 5, 6, 9, 12 and 14 are cross-sectional side views of an exemplary memory device during fabrication.

Turning now to FIG. 2, a cross sectional view of a wafer portion 200 is illustrated after the formation of an etch stop layers and a mandrel layer. The wafer portion 200 comprises an SOI wafer, and as such includes an. SOI layer 202 and a buried insulator layer 204. On top of the SOI layer is formed an etch stop layer. On top of etch stop layer 206 is formed a mandrel layer 212.

Figure 3:
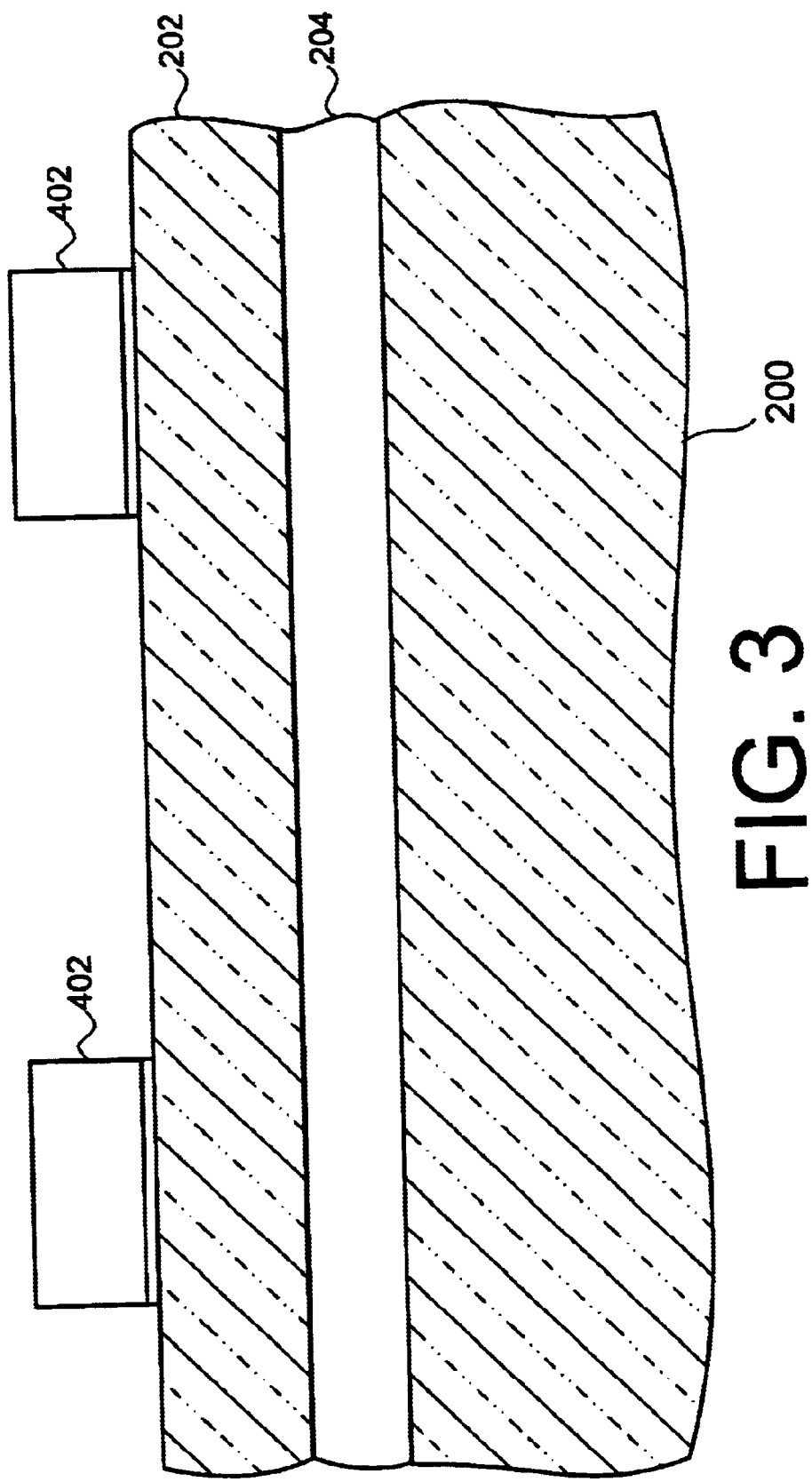

Turning now to FIG. 3, a cross sectional view of a wafer portion 200 is illustrated after the mandrel layer has been patterned. Again, the patterned mandrel layer provides the mandrel shapes 402 that will be used in the sidewall image transfer.

Figure 4:
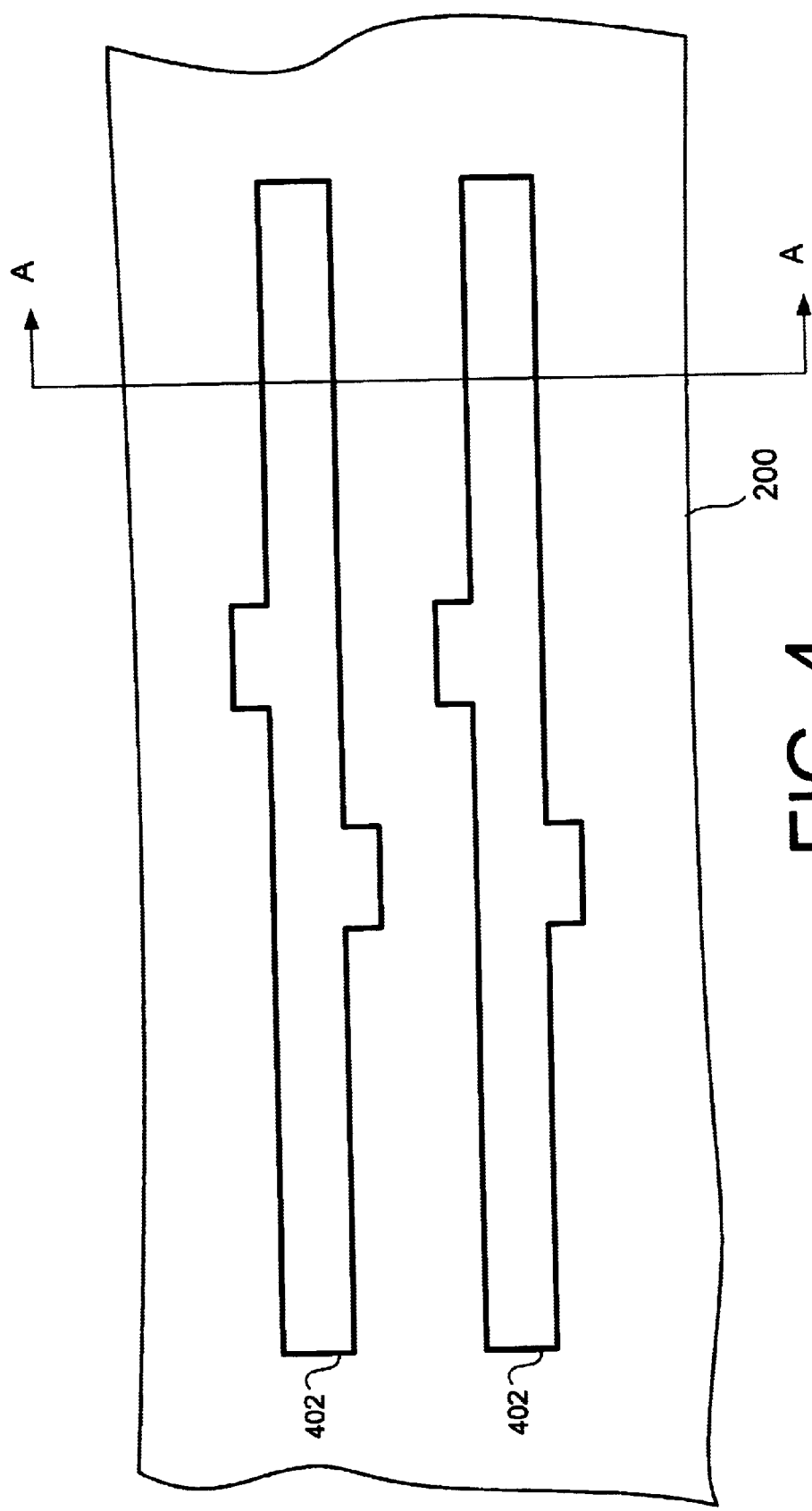
FIGS. 4, 7, 8, 10, 11 and 13 are top views of an exemplary memory device during fabrication.

Turning now to FIG. 4, a top view of the wafer portion 200 is illustrated, including a cross sectional line A—A that defines the FIG. 3 and the other cross sectional views. Those skilled in the art will recognize that FIG. 4, and the other top views illustrated herein and not drawn to the same scale as FIG. 3 and the other cross sectional views. FIG. 4 illustrates the mandrel shapes 402 formed on the wafer portion 200 that will be used to the define the fins that make up the fin memory cells. As will become clear, the mandrel shapes 402 will be used to define the fins that will be used to form eight DRAM fin memory cells.

Figure 5:
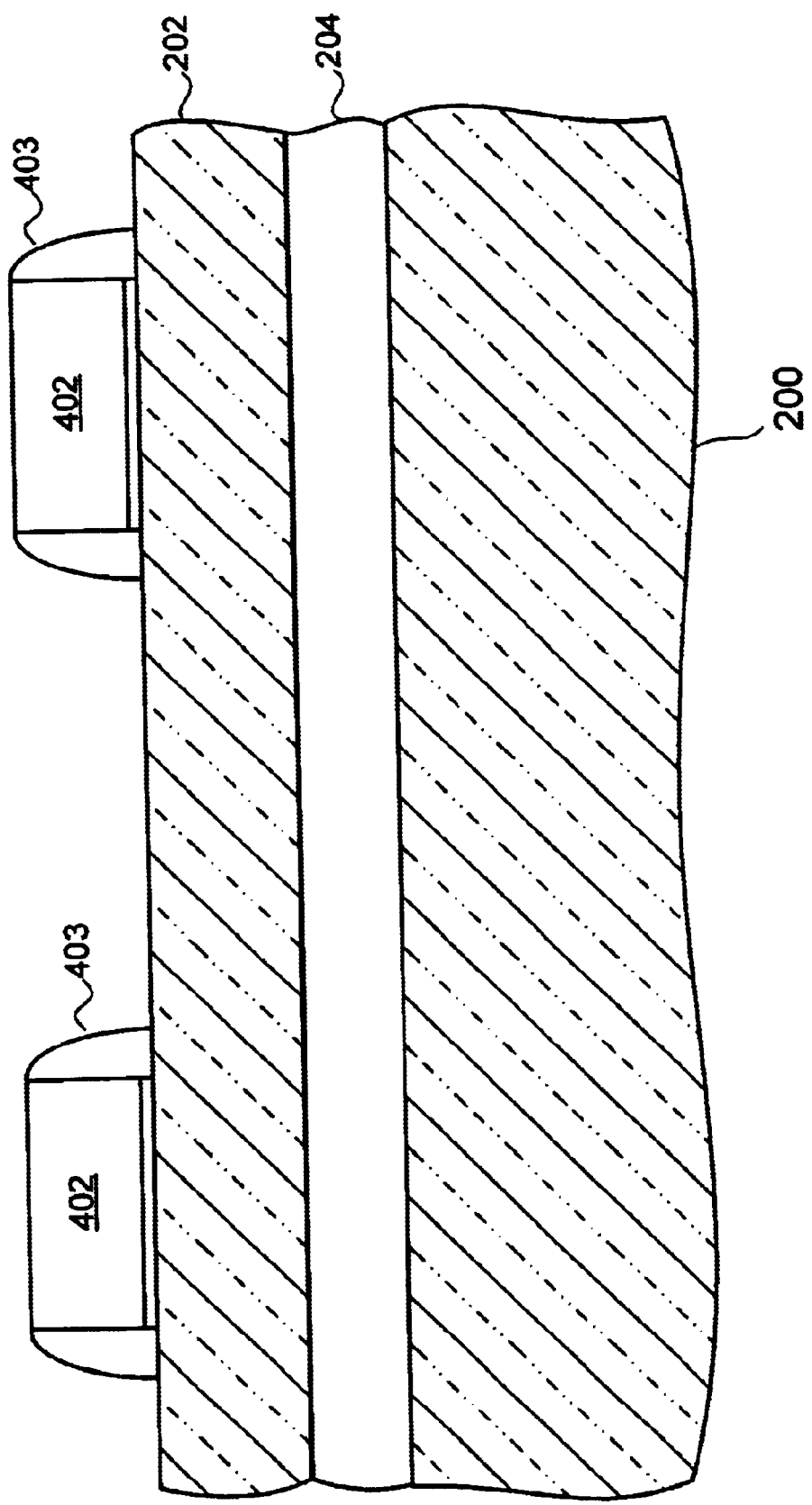
Figure 6:
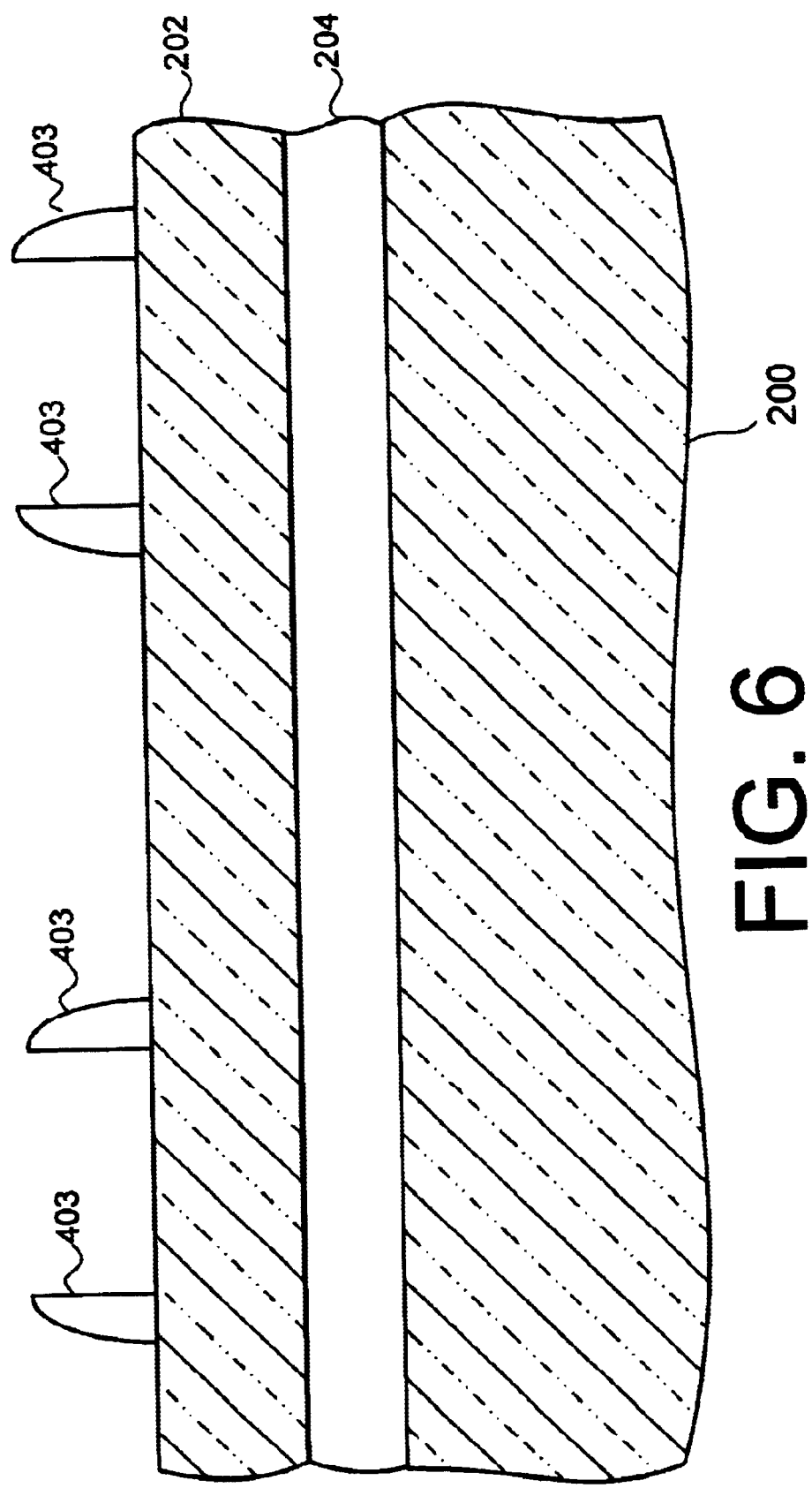

Turning now to FIG. 5, a cross sectional view of wafer portion 200 is illustrated after the formation of sidewall spacers 403 on the sidewalls of mandrel shapes 402. Turning now to FIG. 6, a cross sectional view of wafer portion 200 is illustrated after the mandrel shapes 402 and etch stop layer 206 have been removed, leaving only a loop of sidewall spacer 403 around the old perimeter of the mandrel shapes. Because this process has naturally formed sidewall spacers on all edges of the mandrel shapes, the sidewall spacers will generally comprise "loops" of material. As will be described next, these loops will be trimmed to provide for discrete fin structures.

Returning to FIG. 1, the next step 106 is to trim the fin pattern. The fin pattern is trimmed to turn the loops into discrete shapes. Specifically, the ends of each fin pattern loop are removed, making two fin patterns from each loop. This can be done using any suitable patterning technique, such as depositing and patterning a suitable photoresist to expose only the ends of the loops, and then etching away the exposed ends. The remaining photoresist is then stripped, leaving the discrete fin patterns.

Figure 7:
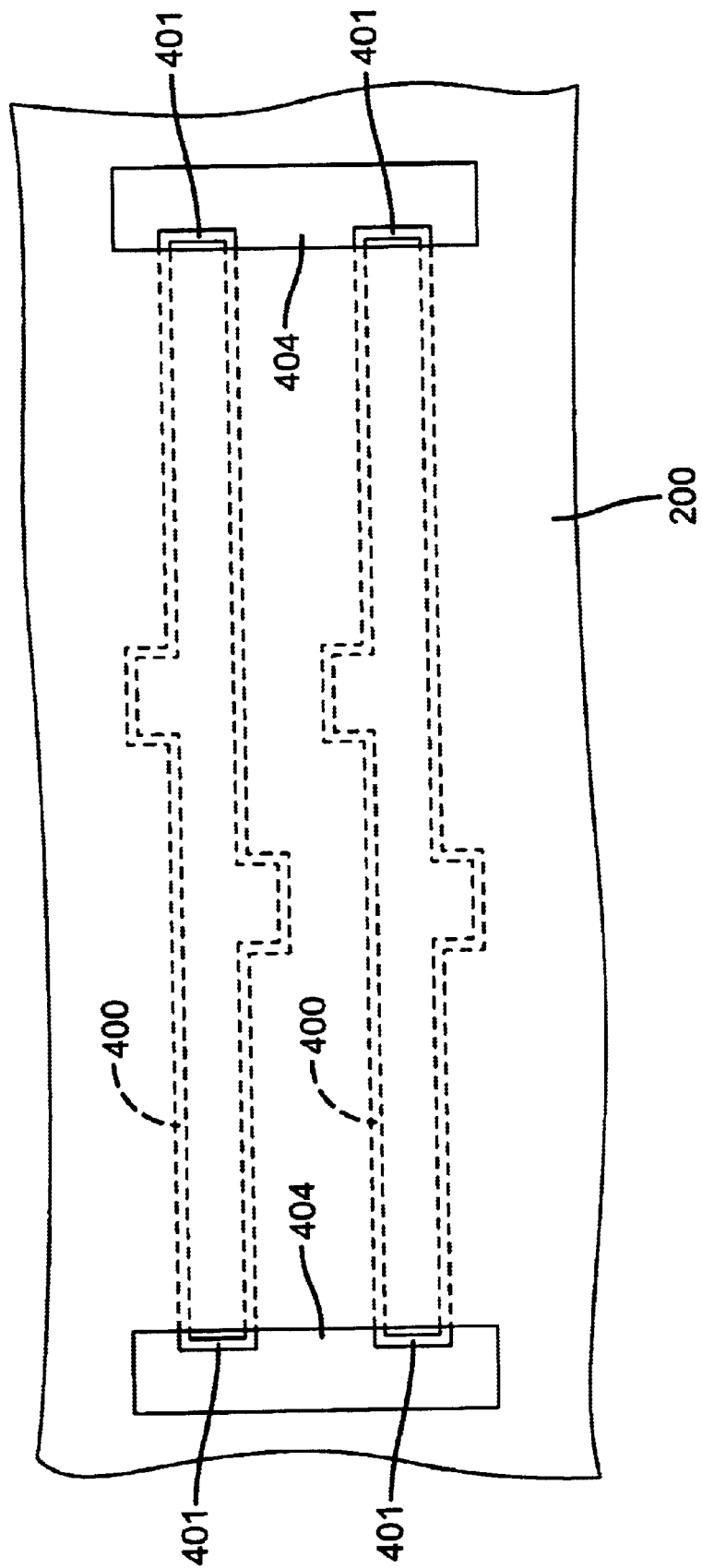
Figure 8:
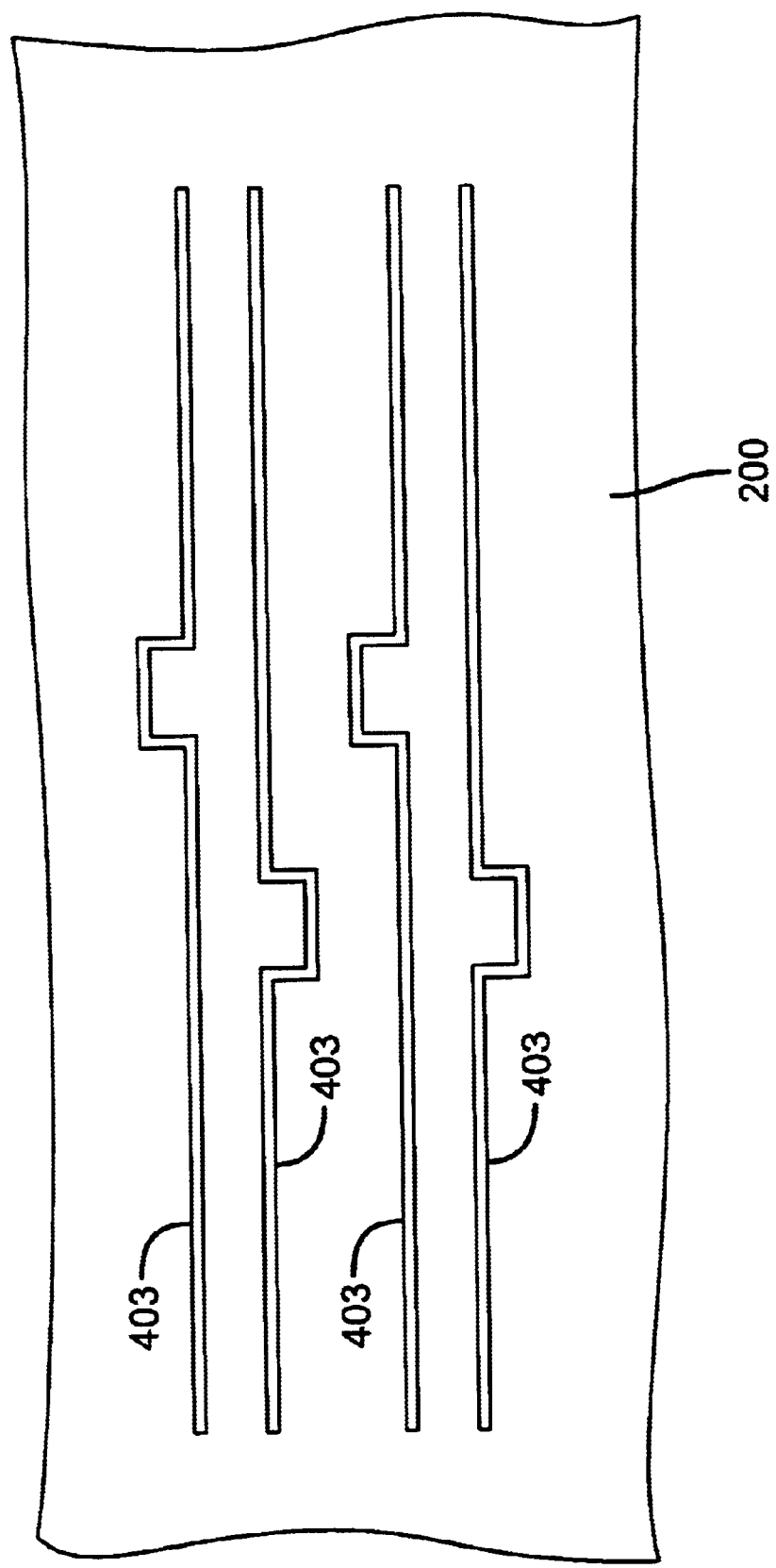

Turning now to FIG. 7, a top view of wafer portion 200 is illustrated with the fin patterns 400 covered by a suitable photoresist. The portion of the fin pattern 400 covered by the photoresist is shown in dashed lines. Openings 404 have been made in the photoresist exposing the ends of sidewall spacers 403. This allows the ends 401 of the fin pattern 400 to be removed using a suitable etch. Turning now to FIG. 8, a top view of the wafer portion 200 is illustrated after the ends 401 of the fin patterns 400 have been trimmed and the photoresist removed. This process turns each loop of the fin pattern into a two discrete fin patterns 403 from each fin pattern 400 of FIG. 7. As will become clear, two DRAM memory cells will be formed with each discrete fin pattern 403.

Returning to FIG. 1, the next step 108 is to etch the SOI layer to form the fins. This can be done using any suitable etch that is selective to the fin pattern. The SOI layer is etched selective to the fin pattern, forming a "fin" structure for each pattern that will comprise the body of the fin transistors and the fin capacitors in the memory cell. This etch transfers the trimmed sidewall spacer image into the SOI layer, and thus completes the sidewall image transfer.

This is preferably done by using a reactive ion etch that etches the SOI layer selective to the sidewall spacers and stops on the buried insulator layer. In the case where bulk wafers are used, etch stop is performed by other means; such as forming a layer. Alternatively, a timed etch to desired depth could be used.

Figure 9:
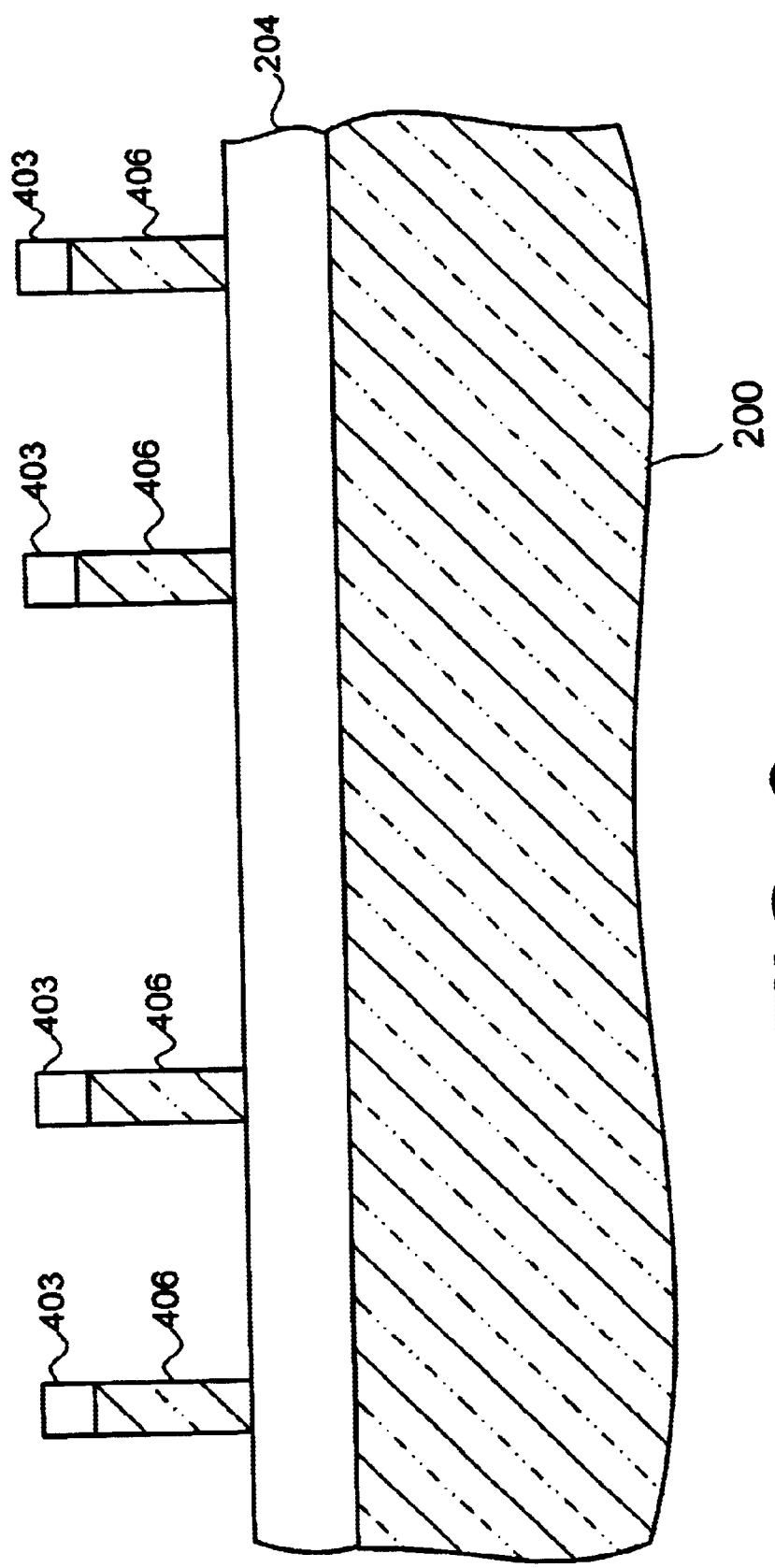

Turning now to FIG. 9, a cross sectional view of wafer portion 200 is illustrated after the fins and have been formed. Specifically, a fin 406 is formed from the SOI layer under each of the sidewall spacers 403 that made up the fin pattern. In the case where bulk wafers are used, etch stop is performed by other means, such as form layer or a timed etch to desired depth.

Returning to FIG. 1, the next step 110 is to form sacrificial oxide on the sidewalls of the fin. Sacrificial oxide is used to clean the exposed sides of the fins and protect the fins during ion implantation. Typically, the sacrificial oxide would be provided by growing a thin layer of thermal oxide.

The next step 112 is to dope the capacitor fins. It is generally desirable to have the fins that make up the storage capacitor of the DRAM cell degenerately doped to improve capacitance. However, the regions of the fin of the transfer transistor should generally not be doped in this way. Thus, the capacitor portions of the fins are selectively exposed using a suitable lithographic process, and those portions of the fins are subjected to a suitable doping implant.

In some cases it will be desirable to perform additional processing on the exposed capacitor portions 412 (see FIG. 10) of the fins. For example, additional or different types of dielectric, such as high k dielectric 415 (see FIG. 14, can be formed only on the capacitor portions 412 of the fins at this time. Other processing of the exposed capacitor portions 412 of the fins could include adding additional conductive material to improve the performance of the capacitor or to give improved process capability with the capacitor dielectric 415.

Figure 10:
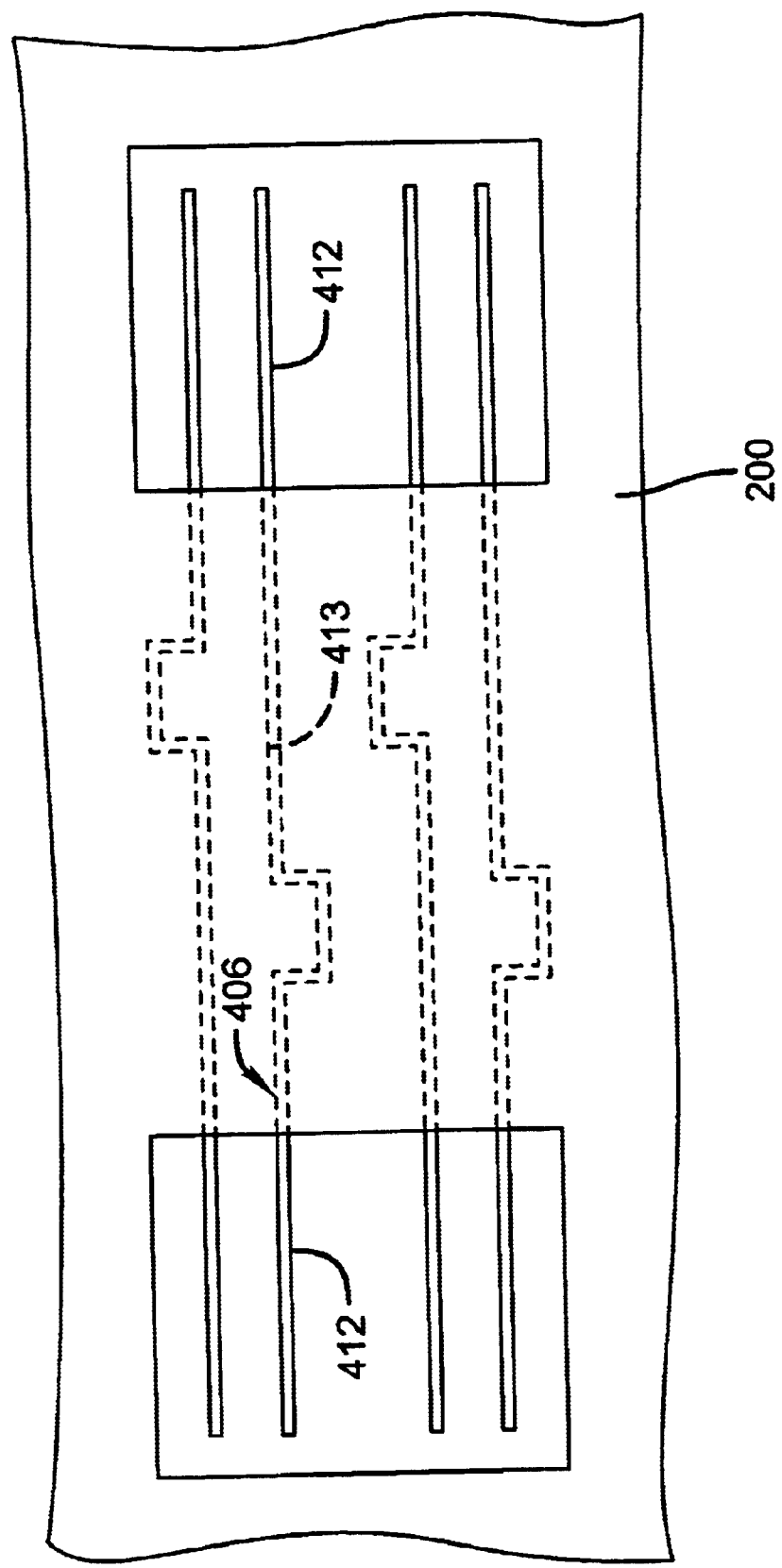

Turning now to FIG. 10, a top view of wafer portion 200 is showing how the fins 406 are selectively exposed during a dopant implant process. This degenerately dopes the capacitor portions 412 of the fins 406, while leaving other portions 413 of the fins 406 undoped. These highly doped portions of the fins 406 will be used to form the storage nodes of the memory cell capacitors. Again, other processing, such as the formation of special capacitor dielectrics can be performed at this time.

Returning now to FIG. 1 the next step 114 is to perform additional fin implants and remove the sacrificial oxide. After the blocking layer from step 112 is removed, additional implants with the appropriate species (depending on whether N-type or p-type transistors are being formed) are made into the fin body. These implants can be performed to properly dope the body and to set the threshold voltage of the transistor. These implants would preferably comprise an angled implant into the exposed sidewall of the SOI layer. The removal of the sacrificial oxide completes the cleaning process and prepares the sidewalls of the fins for the formation of the gate insulator layers.

The next step 116 is to form a gate insulator layer 414 (see FIG. 12) on the sidewalls of the fins 406. This can be provided by forming gate oxide using thermal oxidation, typically at 750–800° C., or any other suitable process.

Figure 11:
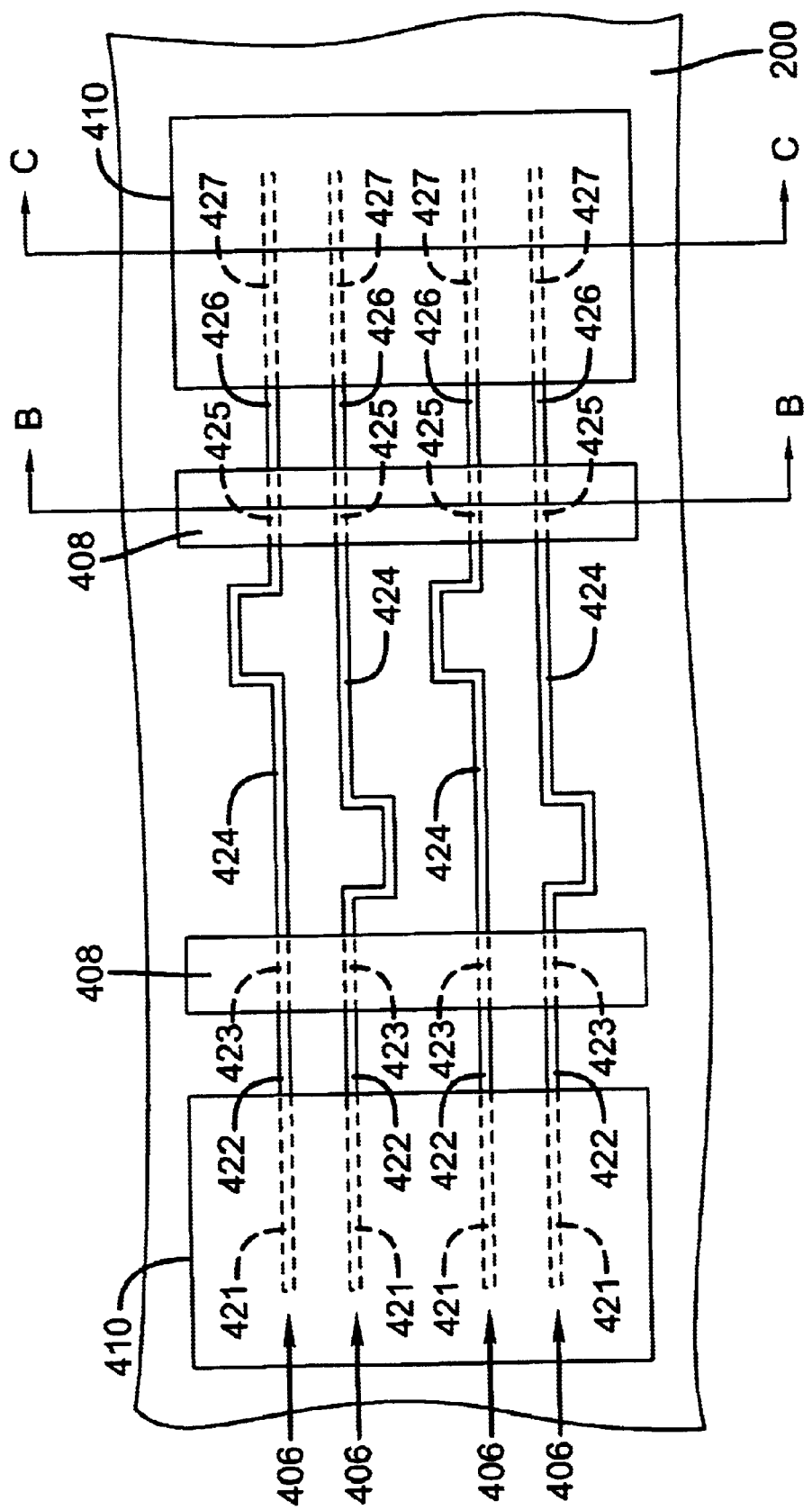
Figure 12:
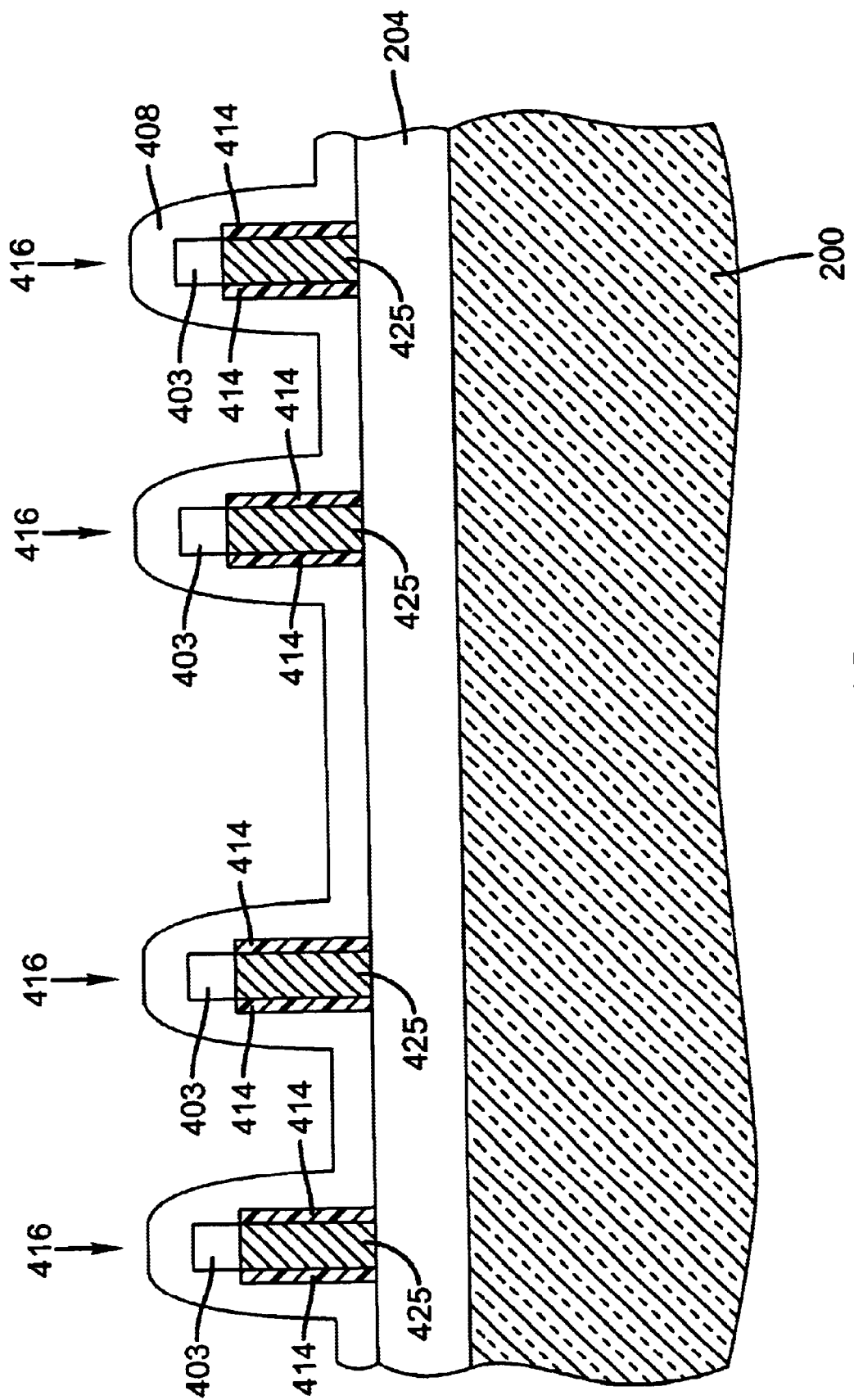
Figure 14:
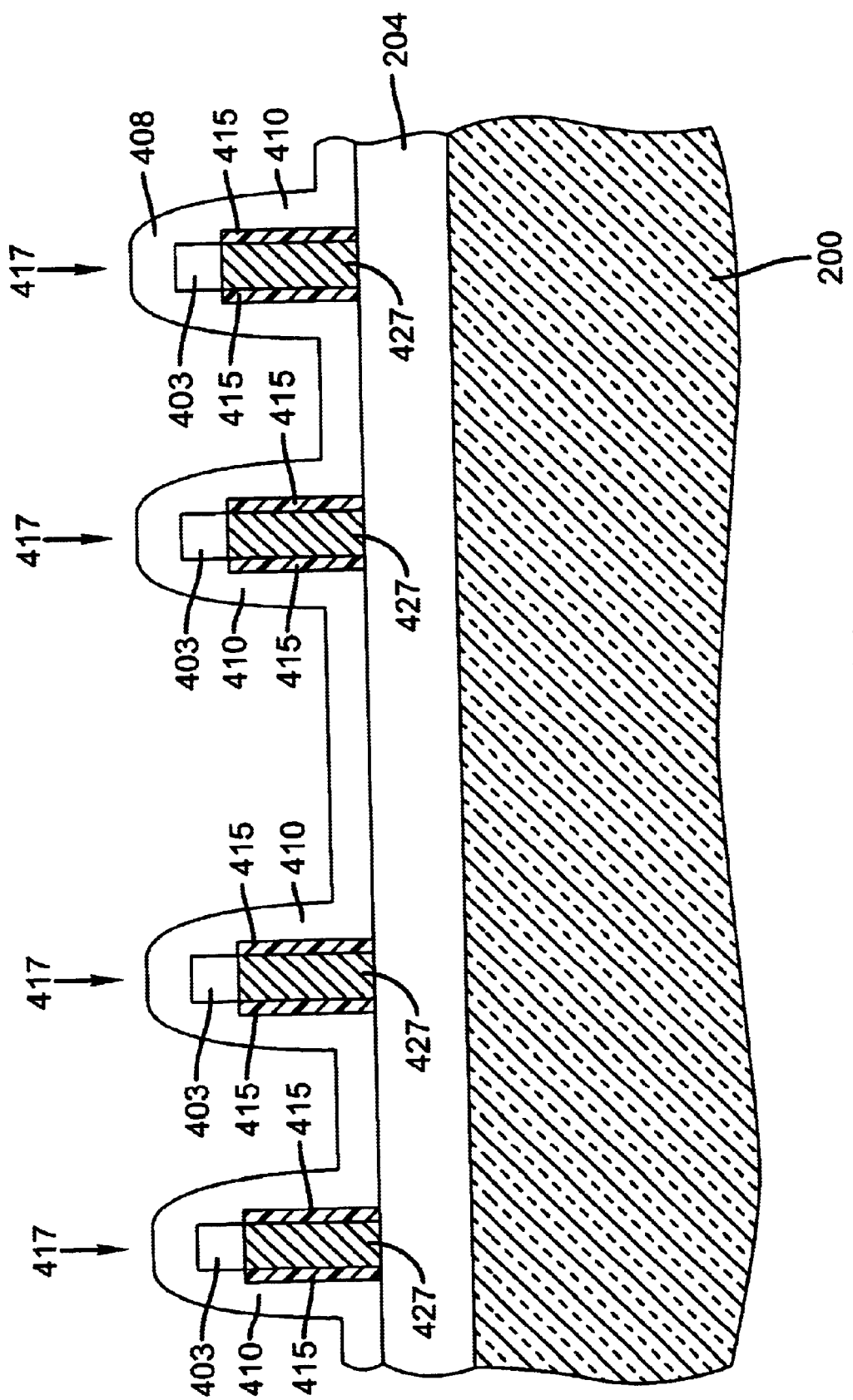

The next step 118 is to form and pattern the gate conductor material. In DRAM cells, the gate conductor material, in addition to forming the gates of the transfer transistors, forms the counter electrode of the capacitors and the word lines used to access the memory cells. A suitable gate conductor material is doped polysilicon. The gate conductor material can be deposited and then doped, or doped in situ. Turning to FIGS. 11, 12, and 14, the wafer portion 200 is illustrated with gate conductor material that has been deposited and patterned. FIG. 11 illustrates a top view of wafer portion 200, FIG. 12 illustrates a cross sectional view taken along line B—B of FIG. 11, FIG. 14 illustrates a cross sectional view taken along line C—C of FIG. 11. In FIGS. 11, and 12, and 14, the gate conductor material has been patterned to form gates 408 and counter electrodes 410. The gates 408 also make up wordlines used to access the memory cell. Each fin (or fin body) 406 in FIG. 11 comprises portions 421–427 as shown. It should be noted that a transfer fin FET is formed at each location in which the gate 408 crosses over a fin 406 at fin portion 423 and 425. Thus, FIG. 11 illustrates the formation of eight separate transfer FETs on wafer portion 200. Additionally, a fin storage capacitor is formed at each location in which a counter electrode 410 crosses over a fin 406 at fin portion 421 and 427. Thus, FIG. 11 illustrates the formation of eight separate fin storage capacitors in wafer portion 200. Note that portions 421 and 427 of the fin 406 embody the capacitor portion 412 shown in FIG. 10. FIG. 12 depicts four transfer FETs 416 on wafer portion 200, with each transfer FET 416 having the gate 408 envelop the spacer 403, the portion 425 of fin 406, and the insulator layer 414. FIG. 14 depicts four fin storage capacitors 417 on wafer portion 200, with each storage capacitor 417 having the counter electrode 410 envelop the spacer 403, the portion 427 of fin 406, and the dielectric layer 415. Note that FIGS. 12 and 14 show an enlarged view of the fins such that the fin thicknesses of fin portions 425 and 427 are shown on a different geometric scale than are the corresponding fin thicknesses in FIG. 11.

Returning to FIG. 1, the next step 120 is to perform a sidewall reoxidation and then to form source/drain implants. The sidewall reoxidation again serves to clean the sides of the fin that may have been damaged during the patterning of the gate structure. The source/drain implants are preferably done by performing an angled implant into the sidewall of the fin to form the source and drain regions. The angled implants preferably comprise arsenic for n-type FETs or boron difluoride for p-type FETs, tilted between 45 degrees and 75 degrees from a ray normal to the plane of the wafer. The doses and energies of the these implants preferably range from between $2\times10^{14}$ to $1\times10^{15}$ cm$^{-2}$ at 0.5 to 5 keV. In FIG. 11, the source/drain may be formed with source formation in portion 424 of fin body 406 adjacent to gate electrode 408 and drain formation in portions 422 and 426 of fin body 406 adjacent to gate electrode 408. Alternatively the source/drain may be formed with drain formation in portion 424 of fin body 406 adjacent to gate electrode 408 and source formation in portions 422 and 426 of fin body 406 adjacent to gate electrode 408.

Returning now to FIG. 1, the next step 122 is to form contacts and complete the memory cells. The contacts formed would typically include bit line contacts and wordline contacts. Additionally, it would also include the formation of contacts to the counter electrodes of the capacitor, allowing the counter electrode to be tied to a potential such as ground or VDD. All of these contacts can be formed using any suitable technique, such as a damascene process where an insulator is deposited, patterned to open vias, and then the vias are filled with a suitable conductive material.

Figure 13:
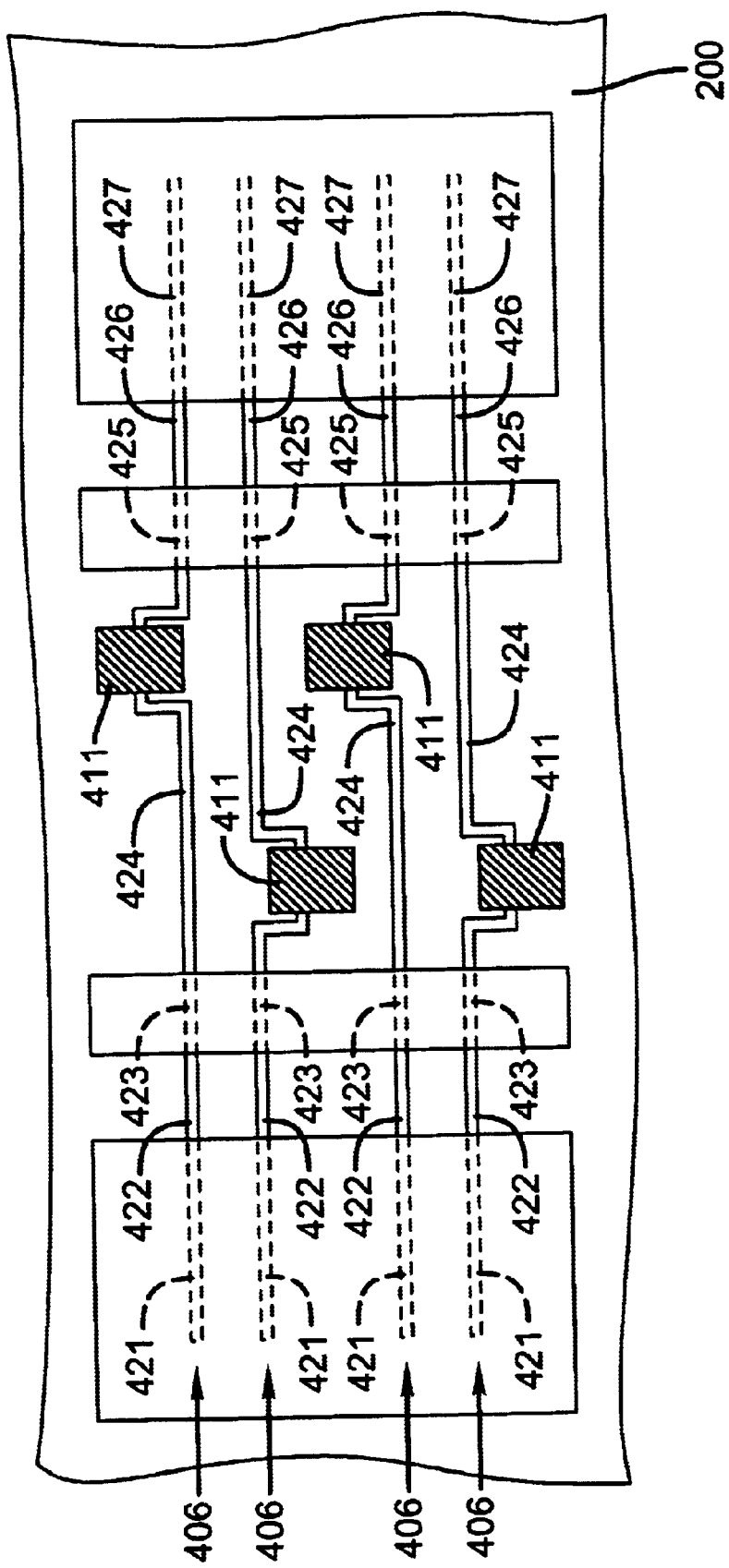

Generally, a bit line contact would be formed across each fin. Turning now to FIG. 13, the wafer portion 200 is illustrated after the bit line contact 411 has been formed within portion 424 across each fin 406.

With the contacts formed, the devices can be completed using any suitable back end of line processing and packaging as desired.

Thus, the present invention provides a memory cell and method for forming the same that results in improved cell density without overly increasing fabrication cost and complexity. The preferred embodiment of the present invention provides a fin design to form the memory cell. Specifically, a fin Field Effect Transistor (FET) is formed to provide the access transistor, and a fin capacitor is formed to provide the storage capacitor. By forming the memory cell with a fin FET and fin capacitor, the memory cell density can be greatly increased over traditional planar capacitor designs. Additionally, the memory cell can be formed with significantly less process cost and complexity than traditional deep trench capacitor designs.

While the invention has been particularly shown and described with reference to an exemplary embodiment using a fin type double gated field effect transistor, those skilled in the art will recognize that the preferred embodiment can be applied to other types of double gated transistors, and that changes in implementation details may be made therein without departing from the spirit and scope of the invention. It will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

What is claimed is:

1. A memory cell, the memory cell comprising:
   a) a fin body;
   b) a gate electrode formed over a first portion of the fin body;
   c) a source and drain formed in the fin body adjacent to the gate electrode; and
   d) a storage capacitor formed with a second portion of the fin body.

2. The memory cell of claim 1 wherein the storage capacitor includes a counter electrode formed over the second portion of the fin body.

3. The memory cell of claim 2 further comprising a capacitor dielectric formed between the fin body and the counter electrode.

4. The memory cell of claim 1 wherein the fin body has a width narrow enough to insure a fully depleted channel when an appropriate potential is applied to the gate electrode.

5. The memory cell of claim 1 wherein the fin body has a first vertical edge and a second vertical edge, and wherein the gate electrode is formed adjacent to the first vertical edge and the second vertical edge.

6. The memory cell of claim 1 wherein the fin body is formed from a silicon-on-insulator layer.

7. The memory cell of claim 1 further comprising:
   i) a second gate electrode formed over a third portion of the fin body;
   ii) a second source and drain formed in the fin body adjacent to the second gate electrode; and
   iii) a storage capacitor formed with a third portion of the fin body.

8. The memory cell of claim 7 wherein the memory cell has a cell area is less than ten lithographic squares.

9. A method for forming a memory cell, the method comprising the steps of:
   a) forming a fin body;
   b) forming a gate electrode over a first portion of the fin body;
   c) forming a capacitor counter electrode over a second portion of the fin body; and
   d) forming a source and drain in the fin body adjacent to the gate electrode.

10. The method of claim 9 further comprising the steps of forming a gate dielectric between the gate electrode and the fin body and forming a capacitor dielectric between the capacitor counter electrode and the fin body.

11. The method of claim 9 wherein the step of forming a fin body comprises using sidewall image transfer to define a fin pattern.

12. The method of claim 11 wherein the step of forming a fin body further comprises trimming the fin pattern.

13. The method of claim 9 wherein the step of forming a gate electrode and forming a capacitor counter electrode comprises depositing a conductive material and patterning the conductive material to form the gate electrode and the capacitor counter electrode.

14. The method of claim 9 further comprising the steps of
   i) forming a second gate electrode over the fin body;
   ii) forming a second capacitor counter electrode over the fin body; and
   iii) forming a second source and a second drain in the fin body adjacent to the second gate electrode.

15. The method of claim 9 further comprising the step of wherein the memory cell has a cell area is less than ten lithographic squares.

16. The method of claim 9 further comprising the step of the doping the second portion of the fin body to form a capacitor electrode.

17. A memory device comprising:
   a) a fin body formed on a substrate, the fin body having a first vertical edge and a second vertical edge;
   b) a first gate structure adjacent a first portion of the fin body first vertical edge and second vertical edge;
   c) a second gate structure adjacent a second portion the fin body first vertical edge and second vertical edge;
   d) a first capacitor dielectric formed adjacent a third portion of the fin body first vertical edge and second vertical edge;
   e) a second capacitor dielectric formed adjacent a fourth portion of the fin body first vertical edge and second vertical edge;
   f) a first counter electrode formed over the first capacitor dielectric; and
   g) a second counter electrode formed over the second capacitor dielectric.

18. The memory device of claim 17 wherein the fin body comprises a portion of a silicon-on-insulator layer.

19. The memory device of claim 17 further comprising an implant into the third and fourth portions of the fin body to form capacitor electrodes.

20. The memory device claim 17 wherein the fin body has a width narrow enough to insure a fully depleted channel when an appropriate potential is applied to the first gate structure.

* * * * *